United States Patent [19]

Takeda

[11] Patent Number: 5,166,040
[45] Date of Patent: Nov. 24, 1992

[54] METHOD OF FORMING A POLYMER IMAGE

[75] Inventor: Keiji Takeda, Kanagawa, Japan

[73] Assignee: Fuji Photo Film Co., Ltd., Kanagawa, Japan

[21] Appl. No.: 294,977

[22] Filed: Jan. 3, 1989

Related U.S. Application Data

[63] Continuation of Ser. No. 113,346, Oct. 23, 1987, abandoned, which is a continuation of Ser. No. 854,640, Apr. 22, 1986, abandoned.

[30] Foreign Application Priority Data

Apr. 22, 1985 [JP] Japan .................................. 60-85903
May 15, 1985 [JP] Japan ................................ 60-103517

[51] Int. Cl.$^5$ .............................................. G03C 5/00
[52] U.S. Cl. ..................... 430/330; 430/270; 430/281; 430/322; 430/495
[58] Field of Search ............... 430/281, 138, 330, 270, 430/322, 325, 495, 348

[56] References Cited

U.S. PATENT DOCUMENTS 4,287,290  9/1981  Mizuno et al. ..................... 430/204
4,560,637 12/1985  Maeda et al. ...................... 430/281

FOREIGN PATENT DOCUMENTS 174634  3/1986  European Pat. Off. .
3206030  9/1982  Fed. Rep. of Germany .

OTHER PUBLICATIONS

Jones, Theory of the Photographic Process, p. 298 (1966).
Warson, The Application of Synthetic Resin Emulsions, pp. 12-13 (1972).

*Primary Examiner*—Jack P. Brammer
*Attorney, Agent, or Firm*—Sughrue, Mion, Zinn, Macpeak & Seas

[57] ABSTRACT

An image recording method comprising imagewise exposing to light a light-sensitive material containing a light-sensitive silver halide, a reducing agent capable of developing a silver halide, a polymerizable vinyl monomer, and a thermal polymerization initiator, to form a latent image of the light-sensitive silver halide, and substantially uniformly heating the exposed light-sensitive material to imagewise polymerize the polymerizable vinyl monomer to form a polymer image, and an image recording material used, therefor are disclosed. The method provides a polymer image with photosensitivity comparable to conventional silver halide light-sensitive materials, which requires only a dry process, for a short time, and allows for use of a reduced amount of a silver halide.

8 Claims, No Drawings

METHOD OF FORMING A POLYMER IMAGE

This is a continuation of application Ser. No. 07/113,346, filed Oct. 23, 1987 abandoned which is a continuation of application Ser. No. 06/854,640 filed Apr. 22, 1986 abandoned.

FIELD OF THE INVENTION

This invention relates to a method for recording photographic images, and, more particularly, to a method of forming a negative or positive polymer image by polymerizing polymerizable monomers in the presence of a silver halide as a trigger of image-forming reaction in a dry process.

BACKGROUND OF THE INVENTION

Techniques for forming a polymer image by photopolymerization in which an organic dye is used as a photosensitizer (photopolymerization initiator) are well known, but the sensitivity reached by these techniques is generally ISO $10^{-3}$ or less (ISO: International Organization for Standardization), which is far inferior to the sensitivity of silver halide photographic materials. Various attempts have heretofore been made in which a silver halide is used as a trigger and the high amplification degree thereof in a development process is utilized for initiation of the polymerization reaction.

For example, Japanese Patent Publication No. 6581/71 and, Japanese Patent Application (OPI) Nos. 138632/82, 142638/82, 176033/82, 107529/83, 169143/83 and 174947/83 (the term "OPI" as herein used means "published unexamined application") and U.S. Pat. Nos. 3,707,379, 3,767,400, 3,782,943, 3,697,273, 3,756,818, 3,687,667, 3,874,947, 3,756,820 and 3,746,542 describe a polymerization method in which the polymerization reaction is initiated by a radical derived from a reducing agent oxidized during development of silver halide. U.S. Pat. No. 3,241,962 describes a polymerization method in which the polymerization reaction is initiated by a radical derived from a peroxide upon redox reaction with a silver image obtained by development of a silver halide. U.S. Pat. No. 3,345,164 discloses a method in which the polymerization reaction is initiated by a radical derived from a peroxide upon redox reaction with a silver ion remaining in non-exposed areas which is dissolved out after development of a silver halide. U.S. Pat. No. 3,029,145 discloses a method in which the polymerization reaction is initiated by a radical derived from a peroxide upon redox reaction with an iron (I) salt remaining in non-exposed areas after development of a silver halide with an iron (I) salt. Further, Japanese Patent Application (OPI) No. 149939/80 teaches a method in which the polymerization reaction is directly initiated by a reducing agent remaining in non-exposed areas after development of a silver halide.

In these methods, a radical is generated directly or after successive reaction from any of raw materials (i.e., silver halide or reducing agent) or products (i.e., silver image or oxidation product of reducing agent) which participate in the development of a silver halide. According to these methods, it is assumed that a polymer image is formed with a sensitivity near to that of a silver halide. However, the above methods all involve a wet process in the development of silver halide and the polymerization in the presence of a radical. Further, the methods using a peroxide are disadvantageous in that dark polymerization takes place in the presence of a radical formed by decomposition of the peroxide, which results in serious deterioration of recording materials and the occurrence of fog. In addition, the polymerization reaction according to these methods generally requires a long time period.

SUMMARY OF THE INVENTION

An object of this invention is to eliminate the above-described disadvantages associated with the prior art, especially the requirement of a wet process, and to provide a method for forming a polymer image with photosensitivity comparable to conventional silver halide light-sensitive materials, which only requires a dry process for a short period of time and a reduced amount of a silver halide.

After thorough analyses of the problems of the conventional methods, the present inventor conducted extensive investigations based upon an entirely new idea. As a result, it has now been found that the above-mentioned problems can be overcome by an image recording method comprising imagewise exposing to light a light-sensitive material containing a light-sensitive silver halide, a reducing agent capable of developing a silver halide, a polymerizable vinyl monomer, and a thermal polymerization initiator, to form a latent image of said silver halide, and then substantially uniformly heating the light-sensitive material to imagewise polymerize the polymerizable vinyl monomer to thereby form a polymer image. The present invention has been completed based on this finding.

DETAILED DESCRIPTION OF THE INVENTION

The image recording method according to the present invention is based on a novel principle entirely different from the known polymer image forming methods using a silver halide. It is known that upon heating of a silver halide having a latent image in the presence of a reducing agent capable of developing, such a silver halide produces a silver image and an oxidized product of the reducing agent. It is also known that heating of a thermal polymerization initiator in the presence of a polymerizable vinyl monomer causes thermal decomposition of the initiator to generate a polymerization initiating species (particularly a free radical), by which a polymerization reaction takes place. The present inventors have found that either of a reducing agent and an oxidation product thereof formed upon development of a silver halide exhibits stronger polymerization inhibitory effect than the another, and thus reached the present invention. The reducing agent or an oxidized product thereof that functions as a polymerization inhibitor can be imagewise distributed by imagewise exposure of a silver halide to light followed by heat development in the presence of a reducing agent. The thus imagewise distributed polymerization inhibitor imagewise inhibits the polymerization initiated with a radical that is evenly generated from a thermal polymerization initiator. As a result, the polymerization reaction imagewise takes place, to thereby form a polymer image. Thus, the image recording method according to this invention can form a polymer image simply by imagewise light-exposure of a light-sensitive material, followed by uniform heating.

The mechanism of polymerization inhibition by a reducing agent or its oxidation product is not yet completely clear, but it would appear that the reducing agent or its oxidation product combines with a radical as initiating species of polymerization, either as generated by heat decomposition of a thermal polymerization initiator or as added to a monomer, to thereby inactivate, i.e., scavenge, the radical. Which of the reducing agent and its oxidation product more strongly inhibits polymerization decides whether a polymer image is formed in areas having a latent image or in areas wherein a latent image has not been formed, i.e., polarity of the image. In other words, if a reducing agent has stronger polymerization inhibitory activity than its oxidation product, it is converted to an oxidation product having less or no polymerization inhibitory activity upon development of a silver halide in the areas in which a latent image has been formed. Therefore, polymerization occurs by a radical produced from a thermal polymerization initiator due to thermal decomposition thereof in latent image areas to form a negative polymer image. On the other hand, when an oxidation product of a reducing agent exhibits stronger polymerization inhibition than its precursor (i.e., the reducing agent), a strongly polymerization-inhibitory oxidized product is produced in latent image areas, wherein polymerization does not take place; whereas a polymerization reaction easily proceeds in the areas in which no latent image has been formed to thereby form a positive polymer image. The polymer image formation by polymerization can be sufficiently realized if the difference in polymerization inhibitory activity between a reducing agent and an oxidation product thereof exceeds a certain value. For instance, in cases when a reducing agent per se has polymerization inhibitory activity to a certain degree but being less than that of the oxidized product, a polymerization reaction begins when the radicals derived from a thermal polymerization initiator increases by continuing heating to such an extent that the radicals cannot all be scavenged by the reduced agent. On the other hand, since the oxidized product still has a radical-scavenging ability, continuance of heating for a given time keeps the monomer inhibited from polymerization. Therefore, a polymer can be imagewise formed by appropriately selecting the heating time.

In cases when a reducing agent has a stronger polymerization inhibitory activity than the oxidized product thereof, the tendency of the polymerization reaction to occur is reversed. That is, a polymerization reaction begins when radicals derived from a thermal polymerization initiator increase by continuing heating to such an extent that the radicals cannot all be scavenged by the oxidized product. On the other hand, since the reducing agent still has a radical-scavenging ability, continuance of heating for a given time keeps the monomer inhibited from polymerization. Therefore, a polymer can be imagewise formed by appropriately selecting the heating time.

While the mechanism of polymerization inhibition has been accounted for on the assumption that either a reducing agent or an oxidized product thereof scavenges a radical by itself, a radical may be scavenged by not only either of them alone, but also by a composite action with other chemicals species present in a light-sensitive layer, such as a silver ion, a base, etc. It is also assumed that the polymerization inhibition by the reducing agent or its oxidized product is not ascribed to radical-scavenging, but rather to suppression or inhibition of thermal decomposition of the thermal polymerization initiator. In this case, also, such a decomposition-inhibitory activity is thought to be produced by a reducing agent or an oxidation product either alone or in composite with other chemical species. It has not yet been elucidated which of these possible mechanisms actually works, but the scope of this invention is not limited to a particular mechanism.

Whether a polymer image is formed in exposed areas or non-exposed area can also depend on the kind of a silver halide emulsion used or components present in a light-sensitive layer. In the case of negatively working silver halides, a latent image is formed in exposed areas and a reducing agent is converted to an oxidation product by development in exposed areas. The reverse is found in the case of direct reversal emulsions. Further, when in using negatively working silver halide emulsions, a silver image is formed more in non-exposed areas than in exposed areas, and thus producing a larger amount of an oxidation product, under conditions which readily cause fog. The polarity of a finally produced polymer image is decided by these conditions and by difference in polymerization inhibitory activity between a reducing agent and its oxidation product, but all of these possibilities are included within the scope of this invention.

It has been confirmed that which of a reducing agent and an oxidation product thereof possesses a stronger polymerization-inhibitory activity depends upon the kind of a reducing agent, the presence or absence or the kind of other components, e.g., a base, concentrations of the reducing agent or other components, ratios of these concentrations to a concentration of a thermal polymerization initiator, and the like. Further details regarding these factors illustrated in examples hereinafter given.

Since a polymerization reaction can be inhibited with a small amount of an inhibitor, the amount of a silver halide required for elimination or formation of the inhibitor can be reduced, and oxidation of a reducing agent amplificatively occurs in the development of a silver halide. The amplification degree is further enhanced by a chain polymerization reaction of monomers. Hence, in the present invention, a polymer image can be formed with a high photosensitivity comparative to that of a conventional silver halide light-sensitive material by using a silver halide in a far smaller amount than required in the conventional silver halide light-sensitive material. As a result, a light-sensitive material can be obtained at lower cost due to silver saving. Moreover, since development of a silver halide and polymerization can be effected through heating only once, a polymer image can be formed in a dry process within a greatly reduced time period than in accordance with the aforesaid conventional polymerization methods using a silver halide as a trigger in a wet process. These characteristics brought about by the present invention are extremely beneficial.

The light-sensitive material according to the present invention essentially comprises a support having provided thereon a light-sensitive layer composed of a reducing agent, a light-sensitive silver halide, a polymerizable vinyl monomer, a thermal polymerization initiator and, in general, a binder polymer. The light-sensitive layer may be composed of a single layer or two or more layers adjacent to each other, in each of which the above-described components may arbitrarily be incorporated. In view of production cost, a single light-sensitive layer is preferred.

The light-sensitive layer can contain an organic silver salt oxidizing agent, a base or a base precursor and a hot-melt solvent as hereinafter illustrated for the purpose of accelerating the development of a silver halide, which leads to acceleration of polymerization. Further, when it is necessary to visualize a produced polymer image, substances suitable for this purpose can be incorporated in the light-sensitive layer as hereinafter described.

The reducing agents which can be used in the present invention include known compounds generally employed for development of a silver halide. Among them, 1-phenyl-3-pyrazolidone derivatives, aminophenol derivatives and polyhydroxybenzene derivatives are particularly preferred.

Specific examples of preferred reducing agents are pyrazolidone derivatives, e.g., 1-phenyl-3-pyrazolidone (Phenidone), 4-methyl-1-phenyl-3-pyrazolidone, 4,4-dimethyl-1-phenyl-3-pyrazolidone, 4-ethyl-1-phenyl-3-pyrazolidone, 5-methyl-1-phenyl-3-pyrazolidone, 5-phenyl-3-pyrazolidone, 5,5-dimethyl-1-phenyl-3-pyrazolidone, 4,4-dihydroxymethyl-1-phenyl-3-pyrazolidone, 4-methyl-4-hydroxymethyl-1-phenyl-3-pyrazolidone, 4,5-dimethyl-1-phenyl-3-pyrazolidone, 1-p-methoxyphenyl-3-pyrazolidone, 1-p-tolyl-3-pyrazolidone, 2-hydroxymethyl-1-phenyl-3-pyrazolidone, etc.; aminophenol derivatives, e.g., p-, m- or o-aminophenol, 2,6-dichloro-p-aminophenol, 2,6-dimethyl-p-aminophenol, 3,5-dimethyl-p-aminophenol, etc.; polyhydroxybenzenes or alkoxyphenols, e.g., hydroquinone, methylhydroquinone, catechol, p-t-butylcatechol, chlorohydroquinone, p-methoxyphenol, etc.; p-anisidine, o-anisidine, o-, m- or p-phenylenediamine, 2,4-tolylenediamine, 3,4-tolylenediamine, and the like. Of these, derivatives of 1-phenyl-3-pyrazolidone are particularly preferred.

These reducing agents may be used either alone or in combinations of two or more thereof. For the purpose of superadditive development, these reducing agents may be used in combination with other reducing agents that exhibit per se no or poor polymerization inhibitory activity. Such reducing agents to be used in combination can be selected from, e.g., those described as developing agents for silver halides in T. H. James, *The Theory of the Photographic Process*, 4th Ed., Macmillan Publishing Co. (1977).

The silver halide which can be used in the present invention may be any of silver chloride, silver bromide, silver iodide, silver chlorobromide, silver chloroiodide, silver iodobromide and silver chloroiodobromide. Individual silver halide grains may have a uniform halogen composition or may have a multiple structure comprising a core and an outer shell, as described in Japanese Patent Application (OPI) Nos. 154232/82, 108533/83, 48755/84 and 52237/84, U.S. Pat. No. 4,433,048 and European Patent 100,984. Plate-like grains having a thickness of not more than 0.5 μm, a diameter of at least 0.6 μm and an average aspect ratio of 5/1 or more as disclosed in U.S. Pat. Nos. 4,414,310 and 4,435,499 and West German Patent Publication (OLS) No. 3,241,646A1, etc.; or a mono-dispersed emulsion having a nearly uniform grain size distribution as disclosed in Japanese Patent Application (OPI) Nos. 178235/82, 100846/83 and 14829/83, International Publication No. 83/02338A1 , European Patents 64,412A3 and 83,377A1, etc., can also be used in the invention. Epitaxially grown silver halide grains as described in Japanese Patent Application (OPI) No. 16124/81 and U.S. Pat. No. 4,094,684 may also be used. Two or more kinds of silver halide grains that are different in crystal habit, halogen composition, grain size, grain size distribution, etc., can be used in combination. It is possible to control gradation by mixing two or more mono-dispersed emulsions having different grain sizes.

The mean grain size of the silver halide to be used in the invention preferably ranges from 0.001 μm to 10 μm, and more preferably from 0.001 μm to 5 μm. The silver halide emulsion may be prepared by any of the acid process, the neutral process and the ammonia process. The reaction between a soluble silver salt and a soluble halogen salt can be carried out by any of a single jet method, a double jet method, and combinations thereof. The silver halide emulsion may also be prepared by a reverse mixing method, in which grains are formed in the presence of an excessive silver ion, or a so-called controlled double jet method, in which the pAg value is maintained constant. In order to accelerate grain growth, concentrations, amounts or rates of addition of a silver salt and a halogen salt may be increased as taught in Japanese Patent Application (OPI) Nos. 142329/80 and 158124/80, U.S. Pat. No. 3,650,757, etc.

In the formation of silver halide grains, ammonia, an organic thioether derivative as described in Japanese Patent Publication No. 11386/72 or a sulfur-containing compound as described in Japanese Patent Application (OPI) No. 144319/78 may be used as a silver halide solvent.

In the grain formation or physical ripening, a cadmium salt, a zinc salt, a lead salt, a thallium salt, etc., may be present in the system.

In order to correct high or low intensity reciprocity law failure, a water-soluble iridium salt, e.g., iridium (III or IV) chloride, ammonium hexachloroiridate, etc., or a water-soluble rhodium salt, e.g., rhodium chloride, may be used.

After the formation of a precipitate or physical ripening, soluble salts may be removed, if desired, by the noodle washing method or the sedimentation method.

The silver halide emulsion may be used as being primitive, but usually subjected to chemical sensitization before use. Chemical sensitization can be carried out by sulfur sensitization, reduction sensitization, noble metal sensitization, etc., either alone or in combination thereof, that are generally known for use in emulsions of light-sensitive silver halide materials. The chemical sensitization may be effected in the presence of a nitrogen-containing heterocyclic compound as disclosed in Japanese Patent Application (OPI) Nos. 126526/83 and 215644/83.

The silver halide emulsion to be used in the invention may be either of a surface latent image type, in which a latent image is predominantly formed on grain surfaces, or of an inner latent image type, in which a latent image is predominantly formed in the interior of grains. A direct reversal emulsion comprising a combination of an inner latent image type emulsion and a nucleating agent can also be employed. Inner latent image type emulsions suitable for this purpose are described in U.S. Pat. Nos. 2,592,250 and 3,761,276, Japanese Patent Publication No. 3534/83, Japanese Patent Application (OPI) No. 136641/82, etc. Preferred nucleating agents to be used in combination therewith are described in U.S. Pat. Nos. 3,227,552, 4,245,037, 4,255,511, 4,266,031 and 4,276,364, West German Patent Publication (OLS) No. 2,635,316, etc.

The light-sensitive silver halide is coated to a silver coverage of from 1 mg to 10 g per m².

The light-sensitive silver halide emulsion is usually spectrally sensitized. Spectral sensitization is advantageous for enhancement of sensitivity or for selection of photographic wavelength ranges.

Dyes which can be used therefor include methine dyes, cyanine dyes, merocyanine dyes, complex cyanine dyes, complex merocyanine dyes, holopolar cyanine dyes, hemicyanine dyes, styryl dyes, and hemioxonol dyes. Especially useful dyes are cyanine dyes, merocyanine dyes, and complex merocyanine dyes. Any and every basic heterocyclic nucleus which is generally used in cyanine dyes may be applied to these dyes. Such basic heterocyclic nuclei include a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus, a pyridine nucleus, etc.; the above-enumerated nuclei to which an alicyclic hydrocarbon ring is fused; and the above-enumerated nuclei to which an aromatic hydrocarbon ring is fused, e.g., an indolenine nucleus, a benzindolenine nucleus, an indole nucleus, a benzoxazole nucleus, naphthoxazole nucleus, a benzothiazole nucleus, a naphthothiazole nucleus, a benzoselenazole nucleus, a benzimidazole nucleus, a quinoline nucleus, etc. These nuclei may have substituents on their carbon atoms.

To merocyanine dyes or complex merocyanine dyes may be applied a ketomethylene structure-containing nucleus, such as a pyrazolin-5-one nucleus, a thiohydantoin nucleus, a 2-thiooxazolidine-2,4-dione nucleus, a thiazolidine-2,4-dione nucleus, a rhodanine nucleus, a thiobarbituric acid nucleus, or the like 5- to 6-membered heterocyclic nucleus.

These sensitizing dyes may be used singly or in combinations of two or more thereof, and combination of sensitizing dyes is often used, especially for the purpose of supersensitization.

Other dyes which per se do not have any spectralsensitization activity or some other substances which do not substantially absorb any visible rays, but which do have a supersensitization activity may be incorporated in the emulsion together with the sensitizing dyes. Such dyes or substances include, for example, aminostyryl compounds substituted with a nitrogen-containing heterocyclic group (e.g., those described in U.S. Pat. Nos. 2,933,390 and 3,635,721), aromatic organic acid-formaldehyde condensates (e.g., those described in U.S. Pat. No. 3,743,510), cadmium salts, azaindene compounds, etc. In particular, the combinations disclosed in U.S. Pat. Nos. 3,615,613, 3,615,641, 3,617,295, and 3,635,721 are useful.

The recording materials of the present invention may contain, together with a light-sensitive silver halide, an organic silver salt oxidizing agent for the purpose of oxidizing a reducing agent in the areas where a latent image is to be formed when heated. These silver salts are relatively stable to light, but, when heated in the presence of a silver halide having a latent image, oxidize a reducing agent, while being themselves reduced to silver. Examples of such silver salts are silver salts of a fatty acid (e.g., behenic acid, stearic acid, lauric acid, maleic acid, adipic acid, etc.), an aromatic carboxylic acid (e.g., benzoic acid, phthalic acid, terephthalic acid, salicylic acid, etc.), a mercapto group- or thione group-containing compound (e.g., 3-mercapto-4-phenyl-1,2,4-triazole, 2-mercaptobenzimidazole, etc.) or an imino group-containing compound (e.g., benzotriazole or derivatives thereof as described in British Patent 1,173,426 and U.S. Pat. No. 3,635,719, etc.).

Instead of using the organic silver salt oxidizing agent, a compound affording an organic group of the above-described organic silver salts may be used. Such a compound preferably includes the above-recited imino-group containing compounds, e.g., benzotriazole.

Polymerizable vinyl monomers which can be used in the present invention are radical-polymerizable compounds having at least one vinyl group or vinylidene group; and conventionally known esters of acrylic acid or methacrylic acid, metal salts of acrylic acid (e.g., barium acrylate, calcium acrylate, etc.), acrylamide, N,N-methylenebisacrylamide, vinyl-esters, N-vinyl compounds (e.g., N-vinylcarbazole, etc.), vinyl acetates, etc., may be used. Particularly preferred among them are esters of acrylic acid or methacrylic acid. Specific examples of these polymerizable vinyl monomers are shown below, taking esters of acrylic acid as a typical example.

Monoacrylates, e.g., methyl acrylate, ethyl acrylate, butyl acrylate, etc.; diacrylates, e.g., polyethyleneglycol diacrylate, polypropyleneglycol diacrylate, hexanediol diacrylate, glycerin diacrylate, trimethylolpropane diacrylate, pentaerythritol diacrylate, etc.; tri- and tetra-acrylates, e.g., trimethylolpropane triacrylate, pentaerythritol triacrylate, pentaerythritol tetraacrylate; and other various polymerizable prepolymers, for example, oligomers obtained by reaction of a hydroxyl residue of a polyester and acrylic acid, said polyester being formed by condensation of a poly-basic acid (e.g., phthalic acid, isophthalic acid, terephthalic acid, maleic acid, fumaric acid, malonic acid, succinic acid, adipic acid, etc.) and a polyhydric alcohol (e.g., ethylene glycol, propylene glycol, polyethylene glycol, polypropylene glycol, glycerin, trimethylolpropane, trimethylolethane, pentaerythritol, etc.), or, in other words, polyester acrylates (or oligo-ester acrylates) as described in Japanese Patent Publication No. 7361/77, and epoxy acrylates and polyurethane acrylates obtained by reaction of a hydroxyl group-containing acrylate and an isocyanate as described in Japanese Patent Publication No. 41708/73.

Compounds in which one or more acryloyl groups of the above-enumerated compounds are replaced by methacryloyl group or groups, i.e., mixed esters of acrylic acid and methacrylic acid and esters of methacrylic acid, can also be used in the present invention.

These monomers may be used in combinations of two or more thereof.

The thermal polymerization initiator which can be used in the present invention are compounds which are, in general, thermally decomposed upon heating to generate a polymerization initiating species (especially, a radical), and initiators commonly employed for radical polymerization, such as those described in *Fukajugo.-Kaikanjugo* (Addition Polymerization and Ring-Opening Polymerization), pp. 6-18, Kyoritsu Shuppan (1983), are suitably employed in the present invention. Specific examples thereof are azo compounds, e.g., azobis(isobutyronitrile), 1,1'-azobis(1-cyclohexanecarbonitrile), dimethyl-2,2'-azobis(isobutyrate), 2,2'-azobis(2-methylbutyronitrile), azobis(dimethylvaleronitrile), etc.; organic peroxides, e.g., benzoyl peroxide, di-t-butyl peroxide, dicumyl peroxide, cumene hydroperoxide, etc.; sodium p-toluenesulfinate; inorganic peroxides, e.g., hydrogen peroxide, potassium persulfate, ammonium persulfate, etc.; and the like. These compounds can be used singly as a thermal polymerization initiator, but a redox initiator capable of forming a radical upon redox reaction between two components may also be employed. For example, combinations of the above-described inorganic or organic peroxides and reducing agents, such as iron (II) salts, sodium hydrogensulfite, dimethylaniline, etc., can be used.

When a monomer has sufficiently high polymerizability to be polymerized simply by heating, a thermal polymerization initiator is not particularly needed.

A coating layer to be provided on the image-recording material according to the invention preferably contains a binder polymer. Examples of such a binder polymer include water-soluble polymers, e.g., gelatin, polyvinyl alcohol, polyvinyl pyrrolidone, carboxymethyl cellulose, gum arabic, casein, methyl cellulose, etc.; and organic solvent-soluble polymers, e.g., polymethyl methacrylate, polyvinyl chloride, a vinylidene chloride-vinyl chloride copolymer, a vinylidene chloride-acrylonitrile copolymer, polyvinyl acetate, a vinyl acetate-vinyl chloride copolymer, a styrene-acrylonitrile copolymer, a polyester, an ABS resin, a polyamide, chlorinated polyethylene, chlorinated polypropylene, polyvinyl butyral, polyvinyl formal, acetyl cellulose, etc. Solvents to be used for dissolving and coating these polymers include water, acetone, toluene, methylene chloride, methylene dichloride, chloroform, methyl ethyl ketone, ethyl acetate, methyl acetate, dimethylformamide, dimethyl sulfoxide, etc.

These binder polymers may be used either alone or in combinations of two or more thereof. For example, a silver halide is prepared in the form of gelatin emulsion, which may be added to a coating solution comprising a binder other than gelatin and a monomer. In this case, two or more kinds of binders are not necessarily mixed uniformly. Further, the monomer is not also necessarily mixed uniformly with the binder. For example, a water-insoluble monomer may be emulsified in an aqueous solution of a water-soluble binder polymer or may be heterogeneously dispersed therein in the form of microcapsules.

The light-sensitive layer of the invention may contain, if desired, a base or a base precursor capable of forming a base under heat for the purpose of accelerating the development of silver halides and organic silver salt oxidizing agents.

Examples of preferred bases are inorganic bases, such as alkali metal or alkaline earth metal hydroxides, secondary or tertiary phosphates, borates, carbonates, quinolinates or metaborates; ammonium hydroxide, quaternary alkylammonium hydroxides and other metal hydroxides; and organic bases, such as aliphatic amines (e.g., trialkylamines, hydroxylamine, aliphatic polyamines, e.g., triethanolamine, diethanolamine, monoethanolamine, triethylenediamine, etc.), aromatic amines (e.g., N-alkyl-substituted aromatic amines, N-hydroxylalkyl-substituted aromatic amines and bis[p-(dialkylamino)phenyl]methanes), heterocyclic amines, amidines, hydrazine derivatives (e.g., benzoyl hydrazide, malonyldihydrazide, phenylhydrazide, p-tolylhydrazide, phthaldihydrazide, etc.), cyclic amidines, guanidines, cyclic guanidines, and the like. Among them, those having a pKa value of 8 or more are particularly preferred.

In case of incorporating a base in the light-sensitive material, it is desirable that the base be added in the form of a precursor thereof. As base precursors, those capable of releasing a base through some reaction upon heating are preferably used, including a salt of an organic acid and a base capable of decarboxylating and decomposing under heat or a compound capable of decomposing and releasing an amine due to intramolecular nucleophilic substitution, Lossen rearrangement, Beckmann rearrangement, or like reaction. Examples of preferred base precursors are salts of trichloroacetic acid as described in British Patent 998,949, salts of α-sulfonylacetic acid as described in U.S. Pat. No. 4,060,420, salts of propiolic acid as described in Japanese Patent Application (OPI) No. 180537/84, 2-carboxycarboxamide derivatives as described in U.S. Pat. No. 4,088,496, salts of pyrolytic acids, in which an alkali metal or alkaline earth metal component is used as a base component as well as an organic base as described in European Patent Publication No. 125521A, hydroxamcarbamates as described in European Patent Publication No. 120661A, in which Lossen rearrangement is utilized, aldoxime carbamates capable of forming nitrile under heat as described in European Patent Publication No. 118078A, and other base precursors as described in British Patent 998,945, U.S. Pat. No. 3,220,846 and British Patents 1,470,451 and 2,079,480.

Specific examples of base precursors which are especially useful in the invention include guanidine trichloroacetate, methylguanidine trichloroacetate, guanidine phenylsulfonylacetate, guanidine p-chlorophenylsulfonylacetate, guanidine p-methanesulfonylphenylsulfonylacetate, potassium phenylpropiolate, cesium phenylpropiolate, guanidine phenylpropiolate, guanidine p-chlorophenylpropiolate, guanidine 2,4-dichlorophenylpropiolate, diguanidine p-phenylene-bis-propiolate, tetramethylammonium phenylsulfonylacetate and tetramethylammonium phenylpropiolate.

These base precursors may be used either alone or in combinations of two or more thereof.

The light-sensitive layer may further contain, optionally and rather preferably, a hot-melt solvent for the purpose of accelerating the heat development of the silver halide and the organic silver salt oxidizing agent and for accelerating the polymerization reaction. Hot-melt solvents are substances having a melting point in the range of the temperature of the heat development, for example, within the range of from 80° C. to 200° C. and capable of dissolving the reducing agent or softening the light-sensitive layer when in a molten state, so as to accelerate the movement of the reducing agent. The hot-melt solvents can hardly react with silver salts, monomers, or the reducing agent. Such solvents can be selected from a wide range of organic or inorganic compounds. Specific examples of the hot-melt solvents are polyhydroxyl compounds, such as sorbitol, pentaerythritol, trimethylolpropane, trimethylolethane, hexanediol, cyclohexanediol, saponin, etc.; urea, dimethylurea, acetamide, N-methylacetamide, and the like.

The light-sensitive layer may further contain, in addition to the above components, known additives, such as a preservative, an antifoggant, and the like. Further, an antihalation layer, antistatic layer or a protective layer may additionally be provided on the image recording material of the invention.

Supports that can be used in the invention include paper, resin-coated paper, films such as polyethylene terephthalate film and triacetyl cellulose film, an aluminum plate, and the like. A suitable support can be selected therefrom in accordance with the intended use.

Amounts of the above-described components constituting the light-sensitive material of the invention are as follows.

The light-sensitive silver halide is generally used in an amount of from 0.001 to 0.5 g, and preferably from 0.005 to 0.1 g, per gram of the polymerizable vinyl monomer. The organic silver salt oxidizing agent is generally used in an amount of from 0.1 to 20 mols, and preferably from 0.1 to 5 mols, per mol of the silver halide. The reducing agent is used in an amount of from 0.1 to 20 mols, and preferably from 0.5 to 5 mols, per mole of the silver, inclusive of the organic silver salt oxidizing agent, if used. The thermal polymerization initiator is used in an amount of from 0.005 to 1 g, and preferably from 0.01 to 0.5 g, per gram of the polymerizable vinyl monomer. The binder is used in an amount up to 10 g, and preferably up to 2 g, per m². The base or base precursor is used in an amount of up to 3 g, and preferably up to 1 g, per m². The hot-melt solvent is used in an amount of up to 3 g, and preferably up to 1 g, per m².

The dry film thickness of the light-sensitive layer may widely vary depending on the intended use of the recording material. For instance, the light-sensitive layer has a thickness of from 0.1 to 50 μm, and preferably from 0.5 to 10 μm, if in using for general image recording or lithographic printing; or from 1 μm to 5 mm, and preferably from 0.1 to 3 mm, if in using for letterpress printing or relief printing where a relief itself is used.

In the case when the development of a silver salt and/or the polymerization of a polymerizable monomer in the recording material is/are inhibited by oxygen in air, it is preferable to provide an oxygen barrier layer composed of a substance having a low oxygen permeability (e.g., polyvinyl alcohol, gelatin, a copolymer of vinylidene chloride and vinyl chloride or acrylonitrile, etc.) on the surface of the light-sensitive layer. The film thickness of the oxygen barrier layer is up to 20 μm, and preferably up to 5 μm. The oxygen barrier layer can also serve as a protective layer.

Image recording according to the present invention can be carried out by imagewise exposure of the above-described image-recording material, followed by uniform heating, whereby a polymer is imagewise formed on the material.

Imagewise exposure can be performed by the use of a light source emitting a visible ray or ultraviolet ray of a wavelength to which the light-sensitive silver halide (inclusive of a spectrally sensitized one) is sensitive, such as a tungsten lamp, a halogen lamp, a mercury lamp, a fluorescent lamp, a xenon lamp, a laser, a light-emitting diode (LED), a cathode ray tube (CRT), etc. Imagewise exposure may also be effected by using X-rays or electron beams. The exposure varies depending on the sensitivity of the silver halide used but, in general, ranges from $10^{-2}$ to $10^3$ ergs/cm². Heating for development can be carried out by the use of a hot plate, a heat roller, an infrared lamp, an oil bath, a high frequency induction heating device, etc., with the recording material being or not being in contact with such a heating means. Alternatively, a resistive heating element, such as carbon black, may be incorporated into the recording material, which element is electrically charged to generate Joule's heat.

The heating temperature is in the range of from 80° C. to 200° C., and preferably from 100° C. to 130° C., and the heating time is within the range of from 1 to 300 seconds, and preferably from 5 to 60 seconds. In the case where oxygen in air inhibits the polymerization reaction and/or the development of a silver salt, heating may be effected with a plastic film or the like in intimate contact with the light-sensitive layer.

The polymer thus imagewise formed is converted to a visible image or developed by various methods in accordance with the intended use of the recording material, to finally obtain the desired image. For instance, if the recording material is used as a printing plate or a relief, it may be developed with a solvent. Solvents which can be used are those which do not dissolve the polymer image area but do dissolve the other, non-hardened, area. In cases when a water-soluble polymer, such as polyvinyl alcohol, is used as a binder, the material may be developed with water. In this case, a dye or a pigment which does not desensitize or hardly desensitizes a silver halide is preferably incorporated previously in the light-sensitive layer, whereby a visible image may be directly formed by solvent-development. On the other hand, the former polymer image can be converted to a visible image by a dry process only. As described, e.g., in Japanese Patent Publication No. 40537/78, the polymerized area and the non-polymerized area may be separated into two different sheets by peel-apart development making use of a difference in adhesiveness between said polymerized area and non-polymerized area. In order to make the formed image visible, the light-sensitive layer is previously colored as mentioned above. In addition, the material may be treated with a toner (coloring powder) so that the toner selectively adheres only to the non-polymerized area to make it visible.

Moreover, the polymer image may be converted to a visible image by controlling a coloration reaction or a dye-bleaching reaction by means of a polymer. Various conventional methods may be employed therefor, including a method using a two-component type heat-sensitive material, in which the movement, reaction and color formation of the two components upon heating is controlled by using an imagewise formed polymer as a barrier, that is, the non-hardened area is colored in this method, as described in Japanese Patent Application (OPI) No. 89915/77; a method in which a polymer image is utilized as a barrier to control the bleaching of a dye, that is, the non-hardened area is bleached in this method, as described in Japanese Patent Application No. 222717/84; and a method in which a dye is bleached with a non-polymerized monomer as described in Japanese Patent Application No. 222717/84.

Any of these visualizing methods being used in the invention, substances necessary therefor can be added to the light-sensitive layer.

The present invention can be utilized in various applications, for example, to printing plates, proofs, photographic papers, photographic light-sensitive materials, hard copies for video signals, facsimile recording materials, CRT recording materials, copying materials, overhead projection (OHP) films, and so on. In any application, the recording material according to the present invention can achieve image recording with much higher sensitivity than the conventional non-silver salt type recording materials and, if in using a dry process for visualization of a polymer image, the desired image can be recorded on the material only through a dry process. Moreover, the image-recording materials according to the present invention not only provide an image by a dry process but also require a greatly reduced amount of silver as compared with the conventional silver salt type recording materials, while exhibiting virtually equal sensitivity. Thus, the recording materials of the present invention have various advantages over the conventional image-recording materials.

This invention will now be illustrated in greater detail with reference to the following examples, but it should be understood that they are not intended to limit the present invention.

EXAMPLE 1

| | |
|---|---|
| Pentaerythritol tetraacrylate (monomer) | 2.3 g |
| Phthalocyanine | 0.1 g |
| Methylene chloride | 3.0 g |
| 8 wt % aqueous solution of polyvinyl alcohol (average polymerization degree: about 500) | 18.0 g |
| 5 wt % aqueous solution of sodium p-dodecylbenzenesulfonate | 0.8 g |

A mixture comprising the above components was emulsified in an ultrasonic emulsifier for 1 hour to prepare a monomer emulsion.

In 1,500 ml of water were dissolved 6.6 g of benzotriazole and 14 g of gelatin. To the solution, while being stirred at 40° C., was added a solution of 8.5 g of silver nitrate in 50 ml of water over a period of 2 minutes, and the pH value of the resulting solution was adjusted to about 4 to 5 with NaOH to thereby precipitate silver benzotriazole. After any unnecessary salts ($NaNO_3$) were removed therefrom, the solution was adjusted to a pH of 6.0 to prepare 200 g of a silver benzotriazole emulsion.

A coating composition having the following formulation was coated on a polyethylene terephthalate film to a dry film thickness of about 5 μm, followed by drying to obtain a light-sensitive material. The silver coverage was about 0.1 g/m².

| Coating Composition Formulation: | |
|---|---|
| Monomer emulsion | 10.0 g |
| Silver chlorobromide emulsion (containing 10 wt % of silver chlorobromide having a chlorine/bromine molar ratio of 1/1 and 7 wt % of gelatin) | 0.3 g |
| Silver benzotriazole emulsion | 1.2 g |
| Sorbitol | 0.3 g |
| Water | 2.5 g |
| Phenidone | 0.06 g |
| Triethanolamine | 0.10 g |
| Azobisisobutyronitrile | 0.06 g |

The resulting light-sensitive material was exposed to light emitted from a halogen lamp of 50 lux for 5 seconds through a black-and-white step wedge (optical density step: 0.3). The exposed material was then heated at 125° C. for 30 seconds by means of a hot plate with a polyethylene terephthalate film in intimate contact with the exposed light-sensitive material. The film was then peeled off, and the material was dipped in hot water of about 60° C. for 30 seconds while being shaken. The non-exposed area of the light-sensitive layer was dissolved out into water to thereby form a negative blue image comprising six sharp steps on the material.

For comparison, a light-sensitive material was prepared in the same manner as described above, except excluding phenidone from the coating composition formulation. When this comparative material was processed in the same manner as above, the light-sensitive layer was hardened and was not, therefore, dissolved out in water, failing to form an image. For further comparison, a light-sensitive material prepared in the same manner as above but excluding azobisisobutyronitrile from the formulation was processed in the same manner as above. In this case, the entire light-sensitive layer was dissolved out in water because it was not hardened, also failing to form an image.

EXAMPLE 2

The procedure of Example 1 was repeated except for replacing phenidone as used in Example 1 with the same quantity of 4-methyl-4-hydroxymethyl-1-phenyl-3-pyrazolidone. As a result, an image having substantially the same quality as in Example 1 was obtained.

EXAMPLE 3

The procedure of Example 1 was repeated except for replacing azobisisobutyronitrile as used in Example 1 with the same quantity of benzoyl peroxide. As a result, an image having substantially the same quality as in Example 1 was obtained.

EXAMPLE 4

The procedure of Example 1 was repeated except for replacing triethanolamine with the same quantity of malonylhydrazide and changing the heating time to 80 seconds. As a result, an image having substantially the same quality as in Example 1 was obtained.

EXAMPLE 5

A light-sensitive material was prepared in the same manner as described in Example 1, except using a coating composition having the following formulation, in which the monomer emulsion and the silver benzotriazole emulsion were the same as used in Example 1.

| Coating Composition Formulation: | |
|---|---|
| Monomer emulsion | 3.0 g |
| Silver chlorobromide emulsion (containing 10 wt % of silver chlorobromide having a chlorine/bromine molar ratio of 1:1 and 7 wt % of gelatin) | 0.1 g |
| Silver benzotriazole emulsion | 0.4 g |
| 2,6-Dichloro-p-aminophenol | 0.03 g |
| Triethylenediamine | 0.02 g |
| 10 wt % methanolic solution of azobisisobutyronitrile | 0.3 g |
| Sorbitol | 0.1 g |
| Water | 0.5 g |

The resulting light-sensitive material was exposed to light emitted from a halogen lamp of 50 lux for 5 seconds through a step wedge (optical density step: 0.3). After a polyethylene terephthalate film was intimately brought into contact with the light-sensitive layer of the material, the material was heated on a hot plate at 125° C. for 7 seconds. The film was then peeled off, and the material was dipped in water at about 60° C. for 30 seconds while being shaken. The exposed area of the light-sensitive layer was dissolved out into water to thereby form a positive blue image comprising five steps on the material.

EXAMPLE 6

The procedure of Example 5 was repeated except for using 0.03 g of triethanolamine in place of 0.02 g of triethylenediamine. As a result, substantially the same image as in Example 5 was obtained.

EXAMPLE 7

The procedure of Example 5 was repeated except for using 0.02 g of p-aminophenol in place of 0.03 g of 2,6-dichloro-p-aminophenol and changing the heating conditions to 110° C. in temperature and 20 seconds in time. As a result, substantially the same image as in Example 5 was obtained.

EXAMPLE 8

Solutions A and B having the following formulations were prepared, in which the monomer emulsion was the same as used in Example 1:

| Solution A Formulation: | |
| --- | --- |
| Monomer emulsion | 10.0 g |
| Silver chlorobromide emulsion (containing 10 wt % of silver chlorobromide having a chlorine/bromine molar ratio of 1/1 and 7 wt % of gelatin) | 0.4 g |
| Benzotriazole | 0.015 g |
| Sorbitol | 0.3 g |
| 10 wt % aqueous solution of gelatin | 0.4 g |
| Water | 2.0 g |
| Solution B Formulation: | |
| Azobisisobutyronitrile | 0.030 g |
| 4-Methyl-1-phenyl-3-pyrazolidone | 0.033 g |
| Methanol | 1.0 g |

Five grams of Solution A and 1.063 g of Solution B were mixed, and the resulting composition was coated on a polyethylene terephthalate film to a dry film thickness of about 5 μm, followed by drying to prepare a light-sensitive material. The silver coverage was about 0.05 g/m$^2$.

The resulting light-sensitive material was exposed to light emitted from a halogen lamp of 50 lux for 2 seconds through a black-and-white step wedge (optical density step: 0.3). After a polyethylene terephthalate film was brought into intimate contact with the light-sensitive layer of the material, the material was heated on a hot plate at 125° C. for 8 seconds. The film was then peeled off, the material was dipped in water at about 60° C. for 30 seconds while being shaken. The exposed area of the light-sensitive layer was thereby dissolved out into water to form a positive blue image composed of 6 clear steps on the material.

EXAMPLE 9

The procedure of Example 8 was repeated except for replacing the formulation of Solution B with the following formulation:

| Azobisisobutyronitrile | 0.038 g |
| --- | --- |
| 4-Methyl-1-phenyl-3-pyrazolidone | 0.016 g |
| Triethanolamine | .0.028 g |
| Methanol | 1.0 g |

As a result, substantially the same positive image as in Example 8 was formed.

EXAMPLE 10

The procedure of Example 9 was repeated, except for increasing the amount of the 4-methyl-1-phenyl-3-pyrazolidone to 0.033 g and changing the heating time to 50 seconds. As a result, the non-exposed area of the light-sensitive layer was dissolved out in water, to thereby form a negative image composed of clear six steps.

EXAMPLE 11

The procedure of Example 8 was repeated, except for changing the amount of the 4-methyl-1-phenyl-3-pyrazolidone to 0.030 g. As a result, substantially the same positive image as in Example 8 was formed.

EXAMPLE 12

The procedure of Example 10 was repeated except for using 0.030 g of phenidone in place of 0.033 g of 4-methyl-1-phenyl-3-pyrazolidone. As a result, substantially the same negative image as in Example 10 was obtained.

EXAMPLE 13

Solutions C and D having the following formulations were prepared, in which the monomer emulsion and silver benzotriazole emulsion were the same as in Example 1:

| Solution C Formulation: | |
| --- | --- |
| Monomer emulsion | 10.0 g |
| Silver chlorobromide emulsion (the same as used in Example 1) | 0.15 g |
| Silver benzotriazole emulsion | 0.60 g |
| Sorbitol | 0.3 g |
| 10 wt % aqueous solution of gelatin | 0.4 g |
| Water | 2.0 g |
| Solution D Formulation: | |
| Azobisisobutyronitrile | 0.030 g |
| 4-Methyl-1-phenyl-3-pyrazolidone | 0.033 g |
| Triethanolamine | 0.028 g |
| Methanol | 1.0 g |

Five grams of Solution C and 1.091 g of Solution D were mixed, and the resulting composition was coated on a support and dried in the same manner as in Example 8. The resulting light-sensitive material was processed in the same manner as in Example 8, except for conducting the heating for 20 seconds. As a result, the non-exposed area of the light-sensitive layer was dissolved out into water to thereby form a negative blue image composed of six steps on the material.

EXAMPLE 14

The procedure of Example 13 was repeated except for using 0.033 g of 2,6-dichloro-p-aminophenol in place of 0.033 g of 4-methyl-1-phenyl-3-pyrazolidone and conducting the heating for 8 seconds. As a result, the exposed area of the light-sensitive layer was dissolved out into water to thereby form a positive image composed of six steps on the material.

While the invention has been described in detail and with reference to specific embodiments thereof, it will be apparent to one skilled in the art that various changes and modifications can be made therein without departing from the spirit and scope thereof.

What is claimed is:

1. An image recording method comprising:
   (a) imagewise exposing to light a light-sensitive material comprising a support, and a light-sensitive layer comprising at least a light-sensitive silver halide, a polymerizable vinyl monomer, a reducing agent capable of developing said silver halide and a thermal polymerization initiator capable of generating a radical upon thermal decomposition, the silver halide being present in an amount of from 1 mg to 10 g per m² and in an amount of from 0.001 to 0.5 g per gram of the polymerizable vinyl monomer, the reducing agent being present in an amount of from 0.1 to 20 mols per mol of silver present and the thermal polymerization initiator being present in an amount of from 0.005 to 1 g per gram of the polymerizable vinyl monomer and (b) substantially uniformly heating the exposed light-sensitive material to a temperature in the range of from 80° C. to 200° C. under dry conditions to imagewise polymerize the polymerizable vinyl monomer to form a polymer image.

2. An image recording method as in claim 1, wherein a polymer image is formed in the area where a latent image has been formed.

3. An image recording method as in claim 1, wherein a polymer image is formed in the area where a latent image has not been formed.

4. An image recordinng method as in claim 1, wherein said light-sensitive material further contains an organic silver salt oxidizing agent.

5. An image recording method as in claim 4, wherein said light-sensitive silver halide is used in an amount of from 0.001 to 0.5 g per gram of the polymerizable vinyl monomer, said reducing agent is used in an amount of from 0.1 to 20 mols per mol of silver, said thermal polymerization initiator is used in an amount of from 0.005 to 1 g per gram of the polymerizable vinyl monomer, and said organic silver salt oxidizing agent is used in an amount of from 0.1 to 20 mols per mol of the light-sensitive silver halide.

6. An image recording method as in claim 1, wherein the mean grain size of the silver halide ranges from 0.001 μm to 10 μm.

7. An image recording method as in claim 1, wherein said light-sensitive silver halide is used in an amount of from 0.005 to 0.1 g per gram of the polymerizable vinyl monomer, said reducing agent is used in an amount of from 0.5 to 5 mols per mol of silver, and said thermal polymerization initiator is used in an amount of from 0.01 to 0.5 g per gram of the polymerizable vinyl monomer.

8. An image recording method as in claim 5, wherein said light-sensitive silver halide is used in an amount of from 0.005 to 0.1 g per gram of the polymerizable vinyl monomer, said reducing agent is used in an amount of from 0.5 to 5 mols per mol of silver, said thermal polymerization initiator is used in an amount of from 0.01 to 0.5 g per gram of the polymerizable vinyl monomer, and said organic silver salt oxidizing agent is used in an amount of from 0.1 to 5 mols per mol of the light-sensitive silver halide.

* * * * *